(12) United States Patent
Tanaka et al.

(10) Patent No.: US 9,312,163 B2
(45) Date of Patent: Apr. 12, 2016

(54) IMPURITY-DOPED LAYER FORMATION APPARATUS AND ELECTROSTATIC CHUCK PROTECTION METHOD

(75) Inventors: Masaru Tanaka, Yokosuka (JP);
Masashi Kuriyama, Yokosuka (JP);
Hiroki Murooka, Ehime (JP)

(73) Assignees: SUMITOMO HEAVY INDUSTRIES, LTD., Shinagawa-Ku, Tokyo (JP); SEN CORPORATION, Shinagawa-Ku, Tokyo (JP)

( * ) Notice: Subject to any disclaimer, the term of this patent is extended or adjusted under 35 U.S.C. 154(b) by 373 days.

(21) Appl. No.: 13/548,254

(22) Filed: Jul. 13, 2012

(65) Prior Publication Data
US 2013/0019797 A1 Jan. 24, 2013

(30) Foreign Application Priority Data

Jul. 14, 2011 (JP) ................................. 2011-156015

(51) Int. Cl.
*H01J 37/32* (2006.01)
*H01L 21/683* (2006.01)
*H01L 21/687* (2006.01)

(52) U.S. Cl.
CPC ..... *H01L 21/68764* (2013.01); *H01J 37/32871* (2013.01); *H01L 21/6831* (2013.01);
(Continued)

(58) Field of Classification Search
CPC .......... B08B 7/00; C23C 14/48; C23C 14/50; C23C 14/564; C23C 16/4585; C23C 16/4586; H01J 2237/0213; H01J 37/3171; H01J 37/32477; H01J 37/32853; H01J 37/32871; H01J 37/3411; H01J 37/3441; H01J 37/3447; H01J 2237/02–2237/028; H01L 21/02057;
H01L 21/67207; H01L 21/67363; H01L 21/67376; H01L 21/6831; H01L 21/6833; H01L 21/68714; H01L 21/68764; H01L 21/68785; H01L 21/68792; Y10S 148/90; Y10S 156/916; Y10S 414/135; Y10S 414/136; Y10S 414/139; Y10S 438/905; Y10S 438/976
USPC ......... 118/715, 728, 50, 500, 504; 156/345.1, 156/345.51, 345.52, 345.53, 345.54, 345.55
See application file for complete search history.

(56) References Cited

U.S. PATENT DOCUMENTS 4,548,699 A * 10/1985 Hutchinson et al. ...... 204/298.25
4,670,126 A * 6/1987 Messer et al. ............ 204/298.25
(Continued)

FOREIGN PATENT DOCUMENTS

EP 1170774 A1 * 1/2002 ............ H01J 37/317
JP 06-267475 A 9/1994
(Continued)

OTHER PUBLICATIONS

Office Action (Notification of Reasons(s) for Refusal) issued on May 27, 2014, by the Japanese Patent Office in corresponding Japanese Patent Application No. 2011-156015, and an English Translation of the Office Action. (6 pages).

*Primary Examiner* — Parviz Hassanzadeh
*Assistant Examiner* — Stanislav Antolin
(74) *Attorney, Agent, or Firm* — Buchanan Ingersoll & Rooney PC (57) ABSTRACT

An electrostatic chuck protection method includes providing an exposed chuck surface with a protective surface for preventing adherence of foreign materials including a substance exhibiting volatility in a vacuum environment, and removing the protective surface in order to perform a process of forming a substrate electrostatically held on the chuck surface with a surface layer including a substance having volatility in a vacuum chamber. The protective surface may be provided when a low vacuum pumping mode of operation is performed in a vacuum environment surrounding the chuck surface.

9 Claims, 5 Drawing Sheets (52) U.S. Cl.
CPC ......... *H01L21/6833* (2013.01); *H01J 2237/02* (2013.01); *H01J 2237/0203* (2013.01); *Y10T 29/49* (2015.01)

(56) References Cited

U.S. PATENT DOCUMENTS

| | | | | |
|---|---|---|---|---|
| 4,747,928 A * | 5/1988 | Takahashi et al. | ....... | 204/298.09 |
| 4,872,922 A * | 10/1989 | Bunker et al. | ................ | 148/239 |
| 4,915,564 A * | 4/1990 | Eror et al. | ...................... | 414/217 |
| 5,003,183 A * | 3/1991 | Nogami et al. | ............ | 250/492.2 |
| 5,223,112 A * | 6/1993 | Tepman | ................... | 204/298.11 |
| 5,360,986 A * | 11/1994 | Candelaria | ................... | 257/183 |
| 5,772,858 A * | 6/1998 | Tepman | ................... | 204/192.12 |
| 5,852,345 A * | 12/1998 | Armini | ................... | 315/111.81 |
| 5,929,456 A * | 7/1999 | Tamai | ...................... | 250/492.21 |
| 6,014,979 A * | 1/2000 | Van Autryve et al. | ......... | 134/1.1 |
| 6,093,625 A * | 7/2000 | Wagner et al. | ................ | 438/514 |
| 6,098,637 A * | 8/2000 | Parke | .............................. | 134/1.1 |
| 6,207,959 B1 * | 3/2001 | Satoh et al. | ............. | 250/442.11 |
| 6,229,148 B1 * | 5/2001 | Prall et al. | ................ | 250/492.21 |
| 6,444,103 B1 * | 9/2002 | Moslehi et al. | ......... | 204/298.11 |
| 6,555,825 B1 * | 4/2003 | Mitchell et al. | .............. | 250/398 |
| 6,689,221 B2 * | 2/2004 | Ryding et al. | ................ | 118/730 |
| 7,019,315 B2 * | 3/2006 | Sheng et al. | ............. | 250/492.21 |
| 7,304,720 B2 * | 12/2007 | del Puerto et al. | .............. | 355/75 |
| 7,642,150 B2 * | 1/2010 | Arevalo et al. | ................ | 438/215 |
| 2001/0020516 A1 * | 9/2001 | Khan et al. | .................... | 156/345 |
| 2002/0153023 A1 * | 10/2002 | Kuo et al. | ....................... | 134/1.1 |
| 2002/0166762 A1 * | 11/2002 | Hixson et al. | ............. | 204/192.12 |
| 2003/0218728 A1 * | 11/2003 | del Puerto et al. | .............. | 355/51 |
| 2003/0230986 A1 * | 12/2003 | Horsky et al. | ............ | 315/111.81 |
| 2006/0131272 A1 * | 6/2006 | Ito et al. | .......................... | 216/67 |
| 2006/0239681 A1 * | 10/2006 | Viglione et al. | .............. | 396/535 |
| 2007/0170372 A1 * | 7/2007 | Horsky | ......................... | 250/427 |
| 2007/0210260 A1 * | 9/2007 | Horsky et al. | ................. | 250/424 |
| 2007/0262267 A1 * | 11/2007 | Freytsis et al. | .............. | 250/491.1 |
| 2008/0047607 A1 * | 2/2008 | Horsky et al. | ...................... | 137/8 |
| 2008/0061032 A1 * | 3/2008 | Jennings et al. | ................. | 216/58 |
| 2008/0122005 A1 * | 5/2008 | Horsky et al. | .................. | 257/369 |
| 2008/0142726 A1 * | 6/2008 | Relleen et al. | ................ | 250/400 |
| 2009/0139540 A1 * | 6/2009 | Lau | ................................ | 134/1.1 |
| 2009/0200460 A1 * | 8/2009 | Chaney et al. | ................ | 250/282 |
| 2010/0159153 A1 * | 6/2010 | Ota et al. | ........................ | 427/523 |
| 2010/0224482 A1 * | 9/2010 | Yamaguchi et al. | ..... | 204/192.15 |
| 2011/0021011 A1 * | 1/2011 | Sweeney et al. | .............. | 438/515 |
| 2011/0248190 A1 * | 10/2011 | Tanaka et al. | ............. | 250/492.21 |

FOREIGN PATENT DOCUMENTS

| | | | | |
|---|---|---|---|---|
| JP | 2001-343755 A | | 12/2001 | |
| JP | 2001343755 A | * | 12/2001 | ............... G03F 7/20 |
| JP | 2003-045949 A | | 2/2003 | |
| JP | 2005-533353 A | | 11/2005 | |
| JP | 2010-275574 A | | 9/2010 | |
| WO | 2004/008476 A1 | | 1/2004 | |

* cited by examiner

IMPURITY-DOPED LAYER FORMATION APPARATUS AND ELECTROSTATIC CHUCK PROTECTION METHOD

BACKGROUND OF THE INVENTION

1. Field of the Invention

The present invention relates to an impurity-doped layer formation apparatus and an electrostatic chuck protection method.

2. Description of the Related Art

For example, there is known an electron beam exposure apparatus adapted to hold a wafer on an electrostatic chuck and exposure the wafer with an electron beam. A cover is electrostatically attached on the adsorption surface of the electrostatic chuck when a calibration is performed to collect data for correcting the position of exposure by an electron beam or when the vacuum is relieved for maintenance of the exposure apparatus.

SUMMARY OF THE INVENTION

The impurity-doped layer formation apparatus according to one embodiment of the present invention includes: a process chamber configured to perform a process of forming an impurity-doped layer including phosphorus or carbon on a substrate; and an electrostatic chuck accommodated in the process chamber and including a chuck surface for holding the substrate. The impurity-doped layer formation apparatus is configured to shield the chuck surface at least for a certain duration during a process suspension period, in order to suppress transfer of foreign materials including phosphorus or carbon from a surface of the process chamber to the chuck surface.

Another embodiment of the present invention relates to an electrostatic chuck protection method. The method includes: providing a barrier for preventing adherence of foreign materials including phosphorus or carbon on an exposed chuck surface; and removing the provided barrier in order to perform a process of forming an impurity-doped layer including phosphorus or carbon on a substrate electrostatically held on the chuck surface.

Still another embodiment of the present invention relates to a vacuum processing apparatus. The apparatus includes: a process chamber configured to perform a process of forming a surface layer including a substance exhibiting volatility in a vacuum environment on a substrate; and an electrostatic chuck accommodated in the process chamber and including a chuck surface for holding the substrate. A shield of the chuck surface is provided at least for a certain duration during a process suspension period in order to suppress transfer of foreign materials including the substance from a surface of the process chamber to the chuck surface, and the shield of the chuck surface is removed while the process is being performed.

BRIEF DESCRIPTION OF THE DRAWINGS

Embodiments will now be described, by way of example only, with reference to the accompanying drawings which are meant to be exemplary, not limiting, and wherein like elements are numbered alike in several Figures, in which.

DETAILED DESCRIPTION OF THE INVENTION

The invention will now be described by reference to the preferred embodiments. This does not intend to limit the scope of the present invention, but to exemplify the invention.

The process of manufacturing a semiconductor includes a step of forming an impurity-doped layer on the surface of a substrate. This process is normally performed in a vacuum environment by securing a substrate in an electrostatic chuck (also called ESC). Electrostatic adsorption performance of an electrostatic chuck may be reduced due to adherence of foreign materials on the surface of the electrostatic chuck. Reduction in adsorption performance due to adherence of foreign materials reduces the area of contact (increase the distance) between the substrate and the chuck (i.e., the area of heat conduction between the substrate and the chuck). Reduction in the area of heat conduction prevents the temperature on the substrate from being controlled properly during the process of doping the substrate with impurities. As more foreign materials are adhered, it may become impossible to hold the substrate on the electrostatic chuck. If the substrate is held poorly or cannot be held at all, the substrate cannot be doped with impurities properly, increasing the likelihood of producing defective products.

An illustrative purpose of at least one embodiment of the present invention is to provide an impurity-doped layer formation apparatus and an electrostatic chuck protection method capable of suppressing degradation of performance of an electrostatic chuck due to adherence of foreign materials.

Figure 1:
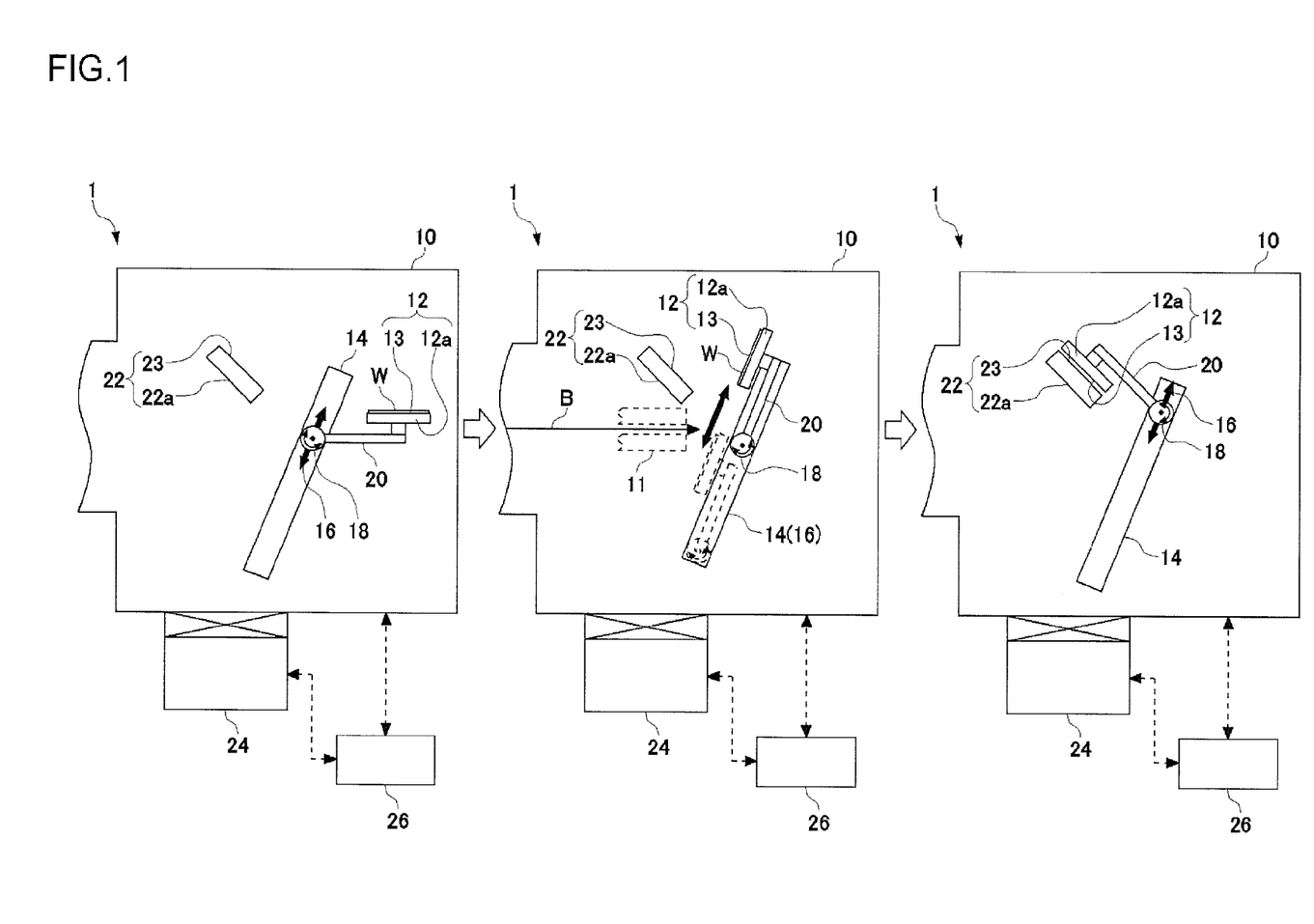
FIG. 1 schematically shows a part of an ion implantation device according to one embodiment of the present invention.

FIG. 1 schematically shows a part of an ion implantation apparatus or device 1 according to one embodiment of the present invention. The ion implantation device 1 is a device for performing an ion implantation process. An ion implantation process is an example of processes for forming a desired impurity-doped layer on the surface of a substrate W. For example, the substrate W is a silicon wafer.

In one exemplary embodiment, the ion implantation process is a process of introducing an impurity element exhibiting volatility in a vacuum, into a substrate. For example, impurities may be phosphorus or carbon.

The ion implantation device 1 shown in FIG. 1 is a vacuum processing apparatus or device for treating the substrate W in a vacuum environment. The vacuum processing device as shown is provided with a vacuum process chamber 10 (also called a chamber). The ion implantation process includes a step of transporting the substrate W into the process chamber 10, a step of implanting ions into the substrate W, and a step of transporting the substrate W out of the chamber. The ion implantation device 1 is configured to perform an ESC protection operation whereby the electrostatic chuck 12 is evacuated for protection while an ion implantation process is not being performed. Details will be described later. The left of FIG. 1 shows a step of transporting a substrate into the chamber, the center of FIG. 1 shows an ion implantation step, and the right of FIG. 1 shows an exemplary ESC protection operation.

The process chamber 10 receives a supply of impurities that should be introduced into the substrate W. In the case of an ion implantation process, impurities are supplied to the process chamber 10 in the form of an ion beam B. The ion implantation device 1 is provided with an ion source, a mass analyzer, and a beam delivery system, upstream of the process chamber 10. The ion source is configured to ionize an element. Of the ions produced by the ion source, the mass analyzer differentiates ions that should be introduced into the substrate W according to the mass. Downstream of the mass analyzer is provided a mass analysis slit for transmitting the ion beam B of ions of a predetermined mass to the beam delivery system. The beam delivery system is configured to transport, accelerate, shape, or scan the ion beam B and supply the resultant beam to the process chamber 10.

The ion beam B incident on the substrate W is scanned on a plane and has an extension on that plane. For example, the plane including the path of the ion beam B is the horizontal plane. As indicated in part by the broken lines in the center of FIG. 1, an ion beam emission port 11 may be provided so as to surround a window of the ion beam B. The ion beam emission port 11 is provided to protrude from the beam delivery system into the process chamber 10. The aperture of the ion beam emission port 11 for emitting the ion beam B is directed to the position on the substrate W receiving the ion beam B.

The electrostatic chuck 12 is provided with a chuck main body 12a and a chuck surface 13. The chuck surface 13 is a surface of the chuck main body 12a and is an adsorption surface in contact with the substrate W to hold and secure the substrate. The chuck main body 12a includes an internal electrode. By applying a voltage to the internal electrode, the electrostatic chuck 12 generates an electrostatic force for holding the substrate W.

The electrostatic chuck 12 may be provided with a temperature control system. The temperature control system may include a flow channel formed in the chuck main body 12a to cause a temperature control fluid to flow, and a fluid supply system for supplying or circulating the temperature control fluid via the flow channel. The substrate W is heated or cooled via a heat conduction path, which includes the area of contact on the chuck surface 13 in contact with the substrate W. For example, the temperature control system may be configured as a cooling system for supplying a coolant for cooling the substrate W to the chuck main body 12a.

A substrate holder 14 for holding the substrate W is accommodated in the process chamber 10. The ion implantation device 1 exemplarily shown in FIG. 1 is of a sheet-fed type, and the substrate holder 14 is configured to support one substrate W. The substrate holder 14 is provided with one electrostatic chuck 12 for securing the substrate W. The substrate holder 14 may be provided with a plurality of electrostatic chucks 12 to hold a plurality of substrates W.

The substrate holder 14 holds the substrate W upright at least during the ion implantation step of the ion implantation process. In other words, the substrate W is held to intersect the ion beam B. The substrate W may be held perpendicular to the ion beam B. Alternatively, the substrate W may be held such that the substrate surface is at an angle (e.g., 20° or less) with respect to the direction perpendicular to the ion beam B for oblique ion implantation.

The substrate holder 14 movably supports the electrostatic chuck 12. The substrate holder 14 is provided with a driving mechanism for moving the electrostatic chuck 12 at least in one direction with respect to the ion beam B. The driving mechanism provides so-called mechanical scan. In other words, the driving mechanism reciprocates the substrate W in the direction of mechanical scan intersecting the ion beam B.

For example, the direction of mechanical scan is perpendicular to the ion beam B. The combination of the scanning of ion beam B and mechanical scan (so-called hybrid scan) causes the ion beam B to irradiate the entirety of an irradiation area on the substrate W. Application of the present invention is not limited to a hybrid scan system such as that described above. It should be clear that the present invention is equally applicable to any other system that allow relative movement of the ion beam B and the substrate W.

The substrate holder 14 is provided with a first driving unit 16 for mechanical scan, and a second driving unit 18 for moving the electrostatic chuck 12 in a degree of freedom different from that of mechanical scan. The first driving unit 16 provides movement in the first direction for mechanical scan, and the second driving unit 18 provides movement in the second direction different from the first direction. For example, the second direction is a rotational direction and the axis of rotation thereof is perpendicular to the first direction. The second driving unit 18 is configured to position the electrostatic chuck 12 at a desired angle of rotation. The second direction may be a linear direction intersecting (e.g., perpendicular to) the first direction.

In the illustrated example, the first driving unit 16 is mounted on the main body of the substrate holder 14, and the second driving unit 18 is mounted on the first driving unit 16. Therefore, the second driving unit 18 can be moved by the first driving unit 16 in the direction of mechanical scan. Conversely, the first driving unit 16 may be mounted on the second driving unit 18 so that the first driving unit 16 can be moved by the second driving unit 18 in the second direction.

The substrate holder 14 is provided with a chuck support member 20 for linking the electrostatic chuck 12 to the second driving unit 18. The chuck support member 20 includes an arm that defines the radius of rotation of the electrostatic chuck 12 by the second driving unit 18. Therefore, the electrostatic chuck 12 is configured to be positioned at a desired position in the process chamber 10 defined by the radius of rotation and the angle of rotation in the second direction.

A shutter member 22 for preventing adherence of foreign materials on the chuck surface 13 of the electrostatic chuck 12 is accommodated in the process chamber 10. The shutter member 22 is secured inside the process chamber 10. The shutter member 22 is provided with a shutter main body 22 and a protective surface 23. The protective surface 23 is a surface of the shutter main body 22a and shields the chuck surface 13 of the electrostatic chuck 12.

For example, the shutter member 22 is a metallic sheet member. The protective surface 23 has the same shape and size as the chuck surface 13. Alternatively, the protective surface 23 has an area covering the chuck surface 13. The protective surface 23 comprises a flat plane or a surface including steps, roughness, or an aperture (e.g., a metal mesh surface).

The shutter member 22 is arranged to provide an evacuation position for the electrostatic chuck 12. For this purpose, the shutter member 22 is located on a path of movement of the electrostatic chuck 12 by the second driving unit 18. The shutter member 22 is fitted to a position where the shutter member 22 and the electrostatic chuck 12 are opposite to or in contact with each other when the electrostatic chuck 12 is positioned at the evacuation position. The orientation of the shutter member 22 is defined such that the chuck surface 13 of the electrostatic chuck 12 is parallel with the protective surface 23.

The shutter member 22 is located outside the path of the ion beam B in the process chamber 10. In other words, the shutter member 22 is located between the wall surface of the process chamber 10 and the ion beam B. The shutter member 22 may be provided between the ion beam emission port 11 and the wall surface of the process chamber 10. The protective surface 23 may be oriented toward an area with a lower concentration of impurities relative to the path of the ion beam B in order to avoid contamination during a process. For example, the protective surface 23 may be oriented toward the wall surface of the process chamber 10 and directed away from the ion beam B.

In another exemplary embodiment, a shutter moving mechanism for moving the shutter member 22 may be provided in the process chamber 10. The shutter member 22 may be configured to be movable between a shielding position for shielding the electrostatic chuck 12 and a standby position where the member 22 is located during an ion implantation process. When the shutter member 22 is located at the shielding position, the shutter member 22 is opposite to or in contact with the electrostatic chuck 12 at the evacuation position. The standby position of the shutter member 22 may be inside the process chamber 10 or outside thereof. In this way, the standby position of the shutter member 22 can be defined at a position where the amount of impurities arriving at the protective surface 23 is suppressed to a minimum level.

A vacuum pumping system 24 for providing the process chamber 10 with a desired vacuum environment for an ion implantation process is provided in the process chamber 10. For example, the vacuum pumping system 24 may be provided with a high-vacuum pump such as a cryopump and a roughing pump for roughing to an operating pressure of the high-vacuum pump. The vacuum pumping system 24 may be provided with a gate valve for connecting or disconnecting the vacuum pump to or from the process chamber 10.

To start an ion implantation process, it is desired that an adequate degree of vacuum is maintained in the process chamber 10. Therefore, in order to ensure that a subsequent process is started readily, the vacuum pumping system 24 is operated and vacuum pumping in the process chamber 10 is continued even in a period when a process is not performed. All this while, vacuum sealing in the process chamber 10 is maintained except when the vacuum should be relieved for, for example, maintenance of the device.

The ion implantation device 1 shown in FIG. 1 is provided with a control device 26 for controlling the ion implantation process. The control device 26 controls the components of the ion implantation device 1. For example, the control device 26 is configured to control the operation of the electrostatic chuck 12, the substrate holder 14, and the vacuum pumping system 24. Further, the control device 26 is configured to monitor the operational status of the electrostatic chuck 12, the substrate holder 14, and the vacuum pumping system 24. In addition to the ion implantation process, the control device 26 is configured to control the ESC protection operation.

In an ion implantation process, the substrate W is transported into the process chamber 10 as shown on the left of FIG. 1. The substrate W is transported from outside the process chamber 10 by a substrate handling device (not shown). In this process, the electrostatic chuck 12 of the substrate holder 14 is positioned by the first driving unit 16 and the second driving unit 18 at an initial position in which the chuck surface 13 is a horizontal setting. The second driving unit 18 locates the electrostatic chuck 12 at the first angle that places the chuck surface 13 in a horizontal position. The adsorption operation of the electrostatic chuck 12 is suspended. The chuck surface 13 of the electrostatic chuck 12 is exposed so as to receive the substrate W.

The substrate W is directly placed on the exposed chuck surface 13. The electrostatic chuck 12 starts holding the substrate W placed on the chuck surface 13. A voltage is applied to the electrode of the electrostatic chuck 12 so that the substrate W is secured on the chuck surface 13 by electrostatic adsorption. This completes the process of transporting the substrate into the process chamber 10. In the substrate transportation process, the ion beam B is not produced. Alternatively, the ion beam B may be directed to a detector (not shown) for beam measurement and to irradiate the detector.

The ion implantation process shown at the center of FIG. 1 is then initiated. The substrate holder 14 moves the substrate W secured to the electrostatic chuck 12 to the position of irradiation. At the position of irradiation, the substrate W is held upright with respect to the direction of incidence of the ion beam B. The substrate W is maintained parallel to the scan movement direction provided by the first driving unit 16. The second driving unit 18 places the electrostatic chuck 12 at a second angle in which the substrate W is held parallel to the scan movement direction provided by the first driving unit 16.

Irradiation by the ion beam B is started. Alternatively, the ion beam B is controlled to stop irradiating the detector for beam measurement and to irradiate the substrate W instead. The ion beam B and the substrate W are swung with respect to each other. In the illustrated example, the ion beam B is scanned in a direction perpendicular to the paper and the substrate W is scanned (makes a reciprocal movement) in the direction of the arrow. This causes the ion beam B to irradiate the irradiation area including the substrate W with the result that the substrate W is irradiated with the ion beam B.

Once impurities of a required dose are implanted into the substrate W, the substrate W is transported out of the process chamber 10. Transportation of the substrate W out of the process chamber 10 is converse to the operation of transporting the substrate W into the chamber. When the scanning of the ion beam B and mechanical scan are completed, the substrate W and the electrostatic chuck 12 are halted at initial positions. The second driving unit 18 rotates the electrostatic chuck 12 from the second angle to the first angle. The adsorption operation of the electrostatic chuck 12 is suspended and the substrate W is released from the fixed state. The substrate W is removed from the electrostatic chuck 12 by the substrate handling device and transported out of the process chamber 10. The chuck surface 13 of the electrostatic chuck 12 is exposed.

The ion beam B and the substrate W are moved relative to each other during a process so that the ion beam B irradiate areas outside the substrate. Most of the impurities in the ion beam B are implanted into the substrate W, but a part of the impurities does not reach the substrate W and is deposited in the peripheral areas, forming an impurity film. The impurities deposited thus are adhered on, for example, the inner wall of the process chamber 10 and the surface of components accommodated in the process chamber 10, contaminating these surfaces.

During a process, the chuck surface 13 of the electrostatic chuck 12 is covered by the substrate W and is not contaminated. However, in a period in which the process is suspended (process suspension period), the substrate W is removed and the chuck surface 13 is exposed. Particles arriving at the chuck surface 13 may be adhered on the chuck surface 13.

Our observation showed that oil-like substance (thin film) are extensively adhered on the chuck surface 13 of the electrostatic chuck 12 when phosphorus is used as impurities. Adherence of foreign materials was conspicuous when a process suspension period lasts for a certain duration (e.g., for several days). Since the process chamber 10 is airtightly sealed, the foreign materials are not introduced from outside. The oil-like film merely gives some luster to the chuck surface 13 on appearance but is identified to affect the performance of the electrostatic chuck 12 considerably.

The impact includes reduction in the area of contact (increasing the distance) between the substrate W and the chuck surface 13 and reduction in the amount of heat transferred between the substrate W and the chuck surface 13. This reduces the effect of cooling the substrate via the cooling system of the electrostatic chuck 12. As a result, the substrate temperature may rise higher than normal during a process so that the patterning resist coating the substrate W may be hardened. This increases the difficulty to peel off the resist and may produce a defective product. Secondly, formation of an oil-like thin film increases the gap between the substrate W and the chuck 13 so that it becomes impossible to hold the substrate W electrostatically.

Our study shows that the phenomenon is due to the fact that phosphorus has higher vapor pressure than boron. Some experimental data or computation indicates that phosphorus has a high vapor pressure on the order of 10Pa in the neighborhood of the room temperature (about 300K). For this reason, phosphorus vapor is violently emitted from phosphorus deposition adhered inside the process chamber 10 due to the process. The vacuum pumping system 24 existing today is not necessarily designed to discharge a large amount of re-vaporized phosphorus completely.

Therefore, the phosphorus deposition adhered inside the chamber can be seen as a secondary source of emitting a contaminant. Similarly, substance with a vacuum vapor pressure higher than that of boron (e.g., substance having a vapor pressure $1\times10^{-2}$ Pa at the temperature of 1000K or lower) can be seen as a secondary source of emitting a contaminant. Example of such substance include As, Bi, Cd, Cs, Ga, In, K, Li, Na, Pb, Rd, Se, Te, Zn, and Tl. These substances can be said to exhibit volatility in the vacuum environment. Predictably, secondary contamination of the chuck surface 13 could also occur in a process in which carbon is used. The vapor pressure of carbon is comparable to that of boron. However, carbon exhibits sublimation in the vacuum. Substance that exhibits sublimation in the vacuum can be said to exhibit volatility in the vacuum environment.

Lately, the vacuum pumping system 24 may be suspended during a process suspension period or the pumping capabilities of the vacuum pumping system 24 may be reduced from the level occurring during a process, for the purpose of saving energy. In this process, the process chamber 10 is maintained in a vacuum state. A secondary source of contaminant results in loss of vacuum during a low vacuum pumping mode of operation (including during suspension of a vacuum pumping operation). The process chamber 10 can be filled with contaminant produced by re-vaporization from the secondary source of contaminant. The vaporized contaminant contaminates the exposed chuck surface 13 progressively seriously.

Secondary contamination during an interval between processes is also of a concern. Generally, an interval between a current process and a subsequent process is quite small if a plurality of substrates are treated consecutively. Therefore, the amount of contamination in a single interval is considered to be satisfactorily small. However, contamination on the chuck surface 13 could increase as a large number of substrates are treated.

In order to completely prevent degradation of chuck performance due to contamination, it is not only necessary to remove the oil-like film adhered on the chuck surface 13 but also remove the secondary contamination source adhered on various portions inside the process chamber 10. This requires turning off the vacuum processing device and cleaning the process chamber 10. Consequently, the rate of operation of the vacuum processing device will be lowered.

In a process based on boron, which is a typical impurity, the issue of contamination as described above does not occur. This is because the vapor pressure of boron is extremely low. For example, the vapor pressure of boron at a high temperature of about 1500K is about $1\times10^{-6}$ Pa. The vapor pressure of boron at the room temperature is considered to be virtually zero. Therefore, even if boron is adhered inside the process chamber 10, impact from its re-evaporation is infinitesimally small or non-existent. In other words, boron adhered inside the chamber cannot possibly become a source of emitting a contaminant.

In one embodiment of the present invention, the ESC protection operation is performed. In order to suppress transfer of foreign materials including a substance of high vapor pressure (e.g., phosphorus or carbon) from the surface of the process chamber 10 to the chuck surface 13, the chuck surface 13 is shielded. The right of FIG. 1 shows an exemplary ESC protection operation and shows the chuck in a standby state.

The control device 26 performs the ESC protection operation at least for a certain duration during a process suspension period. The control device 26 may start the ESC protection operation at a desired point of time during a process suspension period. Similarly, the control device 26 may terminate the ESC protection operation at a desired point of time during a process suspension period.

A process suspension period may include a period in which a low vacuum pumping mode of operation is in practice. A low vacuum pumping mode of operation may include continuing the operation of the impurity-doped layer formation device while the vacuum pumping system 24 is suspended. A low vacuum pumping mode of operation includes continuing the operation of the device while the pumping capabilities of the vacuum pumping system 24 is lowered than during the process. In this process, vacuum may be retained in the process chamber 10 by maintaining the chamber in an air sealed condition. During a low vacuum pumping mode of operation, the concentration of a contaminant in the vacuum environment is increased. By performing the ESC protection operation during a low vacuum pumping mode of operation, the chuck surface 13 can be effectively protected.

A process suspension period may include an idle time. An idle time is a period of time during the impurity-doped layer formation device is in an idle state. In an idle time, the process is temporarily suspended so as to be resumed immediately. An idle time includes an interval between processes for exchange of substrates.

A process suspension period may include an aging time. Aging is a kind of idling operation or a training operation performed to stabilize, for example, the beam condition in the impurity-doped layer formation device. The impurity-doped layer formation device is operated for aging for several hours, for a day, etc. such that the substrate W is not transported into the process chamber 10. Aging is performed during the installation of the impurity-doped layer formation device or upon completion of maintenance.

A process suspension period may include a period of time in which the operation of the impurity-doped layer formation device is suspended. During the period of suspension of operation, the vacuum in the process chamber 10 may be relieved. Maintenance of the device, including cleaning of the process chamber 10, may be performed while the operation is suspended.

The ESC protection operation includes an operation of shielding the chuck surface 13 and an operation of returning to the process. The shielding operation includes providing a barrier for preventing adherence of foreign materials including phosphorus or carbon on the exposed chuck surface 13. Provision of a barrier may include bringing a protective member for the electrostatic chuck 12 to proximity to or contact with the electrostatic chuck 12 while electrostatic adsorption of the electrostatic chuck 12 is relieved. For example, the protective member may be a shutter member 22 or a dummy substrate. The returning operation includes removing the barrier to start a process. The returning operation is performed to perform a process of forming an impurity-doped layer including phosphorus or carbon on the substrate W electrostatically held on the chuck surface 13.

In one exemplary embodiment of the present invention, a method is provided for protecting the electrostatic chuck 12 used in the process chamber 10. This method may comprise supplying impurities to the process chamber 10 to run a process of introducing impurities including phosphorus or carbon into the substrate W electrostatically held on the chuck surface 13, and providing, at least for a certain duration during a process suspension period, the chuck surface 13 with a barrier for preventing transfer of adhered substance including phosphorus or carbon in the process chamber 10 to the chuck surface 13.

As shown in FIG. 1, the ESC protection operation is performed after an ion implantation process. The control device 26 performs the ESC protection operation subsequent to the step of transporting the substrate out of the chamber. The control device 26 controls the substrate holder 14 so as to move the electrostatic chuck 12 to the evacuation position. More specifically, the first driving unit 16 of the substrate holder 14 moves the second driving unit 18 and the electrostatic chuck 12 to a predefined position encountered in the first direction. The second driving unit 18 rotates the electrostatic chuck 12 to a third angle different from the first and second angles described above. The chuck surface 13 of the electrostatic chuck 12 positioned thus at the evacuation position faces the protective surface 23 of the shutter member 22. The chuck surface 13 is covered by the protective surface 23. In this way, a barrier for preventing adherence of foreign materials is provided to the chuck surface 13.

The chuck surface 13 and the protective surface 23 are close to each other. For example, the interval between the chuck surface 13 and the protective surface 23 is, for example, 1 cm or less, and, more preferably, 5 mm or less. By spacing the chuck surface 13 apart from the protective surface 23, the likelihood of interference or collision between them is reduced. It will further prevent particles originating from the protective surface 23 itself from being adhered on the chuck surface 13 due to contact between the surfaces 13 and 23.

To terminate the ESC protection operation, the control device 26 controls the substrate holder 14 to move the electrostatic chuck 12 from the evacuation position. For example, the electrostatic chuck 12 is moved to a position for receiving the substrate W to be treated next. In this case, the second driving unit 18 rotates the electrostatic chuck 12 from the third angle to the first angle. This removes the barrier provided to the chuck surface 13. The above-described ion implantation process can be performed again.

The chuck surface 13 and the protective surface 23 may be brought to contact with each other in the ESC protection operation. By bringing the chuck surface 13 into intimate contact with the protective surface 23, arrival of a contaminant such as vaporized phosphorus to the chuck surface 13 is more properly prevented. Protection of the chuck surface 13 is reinforced.

Preferably, the electrostatic chuck 12 is turned off while the chuck surface 13 is being shielded. In other words, the shutter member 22 is merely in contact with the electrostatic chuck 12 or located at a distance from the chuck 12. The electrostatic chuck 12 does not secure the shutter member 22 in its position. The ESC protection operation may extend over a long period (e.g., several days). Generally, prolonged application of a voltage to the electrostatic chuck 12 may reduce the dechucking performance due to persisting polarization. By turning off the electrostatic chuck 12, reduction in the dechucking performance is prevented.

In one exemplary embodiment, the electrostatic chuck 12 may be provided with an engagement part provided external to the chuck surface 13. The engagement part projects from the chuck main body 12a beyond the chuck surface 13. As the engagement part comes into contact with the protective surface 23, it is ensured that a certain gap is maintained between the chuck surface 13 and the protective surface 23. The engagement part may include a peripheral wall surrounding the chuck surface 13. A closed space may be formed between the chuck surface 13 and the protective surface 23 as the peripheral wall comes into contact with the protective surface 23. This can prevent arrival of the vaporized contaminant to the chuck surface 13 more properly.

Location of the shutter member 22 on a movement path of the electrostatic chuck 12 is advantageous in that the mechanism for moving the electrostatic chuck 12 can also be used to shield the chuck surface 13. The electrostatic chuck 12 can be protected with a simple operation while airtightness of the process chamber 10 is maintained, i.e., without vent of the vacuum.

In the exemplary embodiment described above, the evacuation position is defined at the end of the range in which the electrostatic chuck 12 can be moved by the second driving unit 18. Alternatively, the evacuation position of the electrostatic chuck 12 may be defined at the end of the range of movement by the first driving unit 16. For example, the evacuation position is defined beyond the range in which the electrostatic chuck 12 can be moved for mechanical scan.

As in the exemplary embodiment described above, the shutter member 22 is provided at a position opposite to the electrostatic chuck 12.

Figure 2:
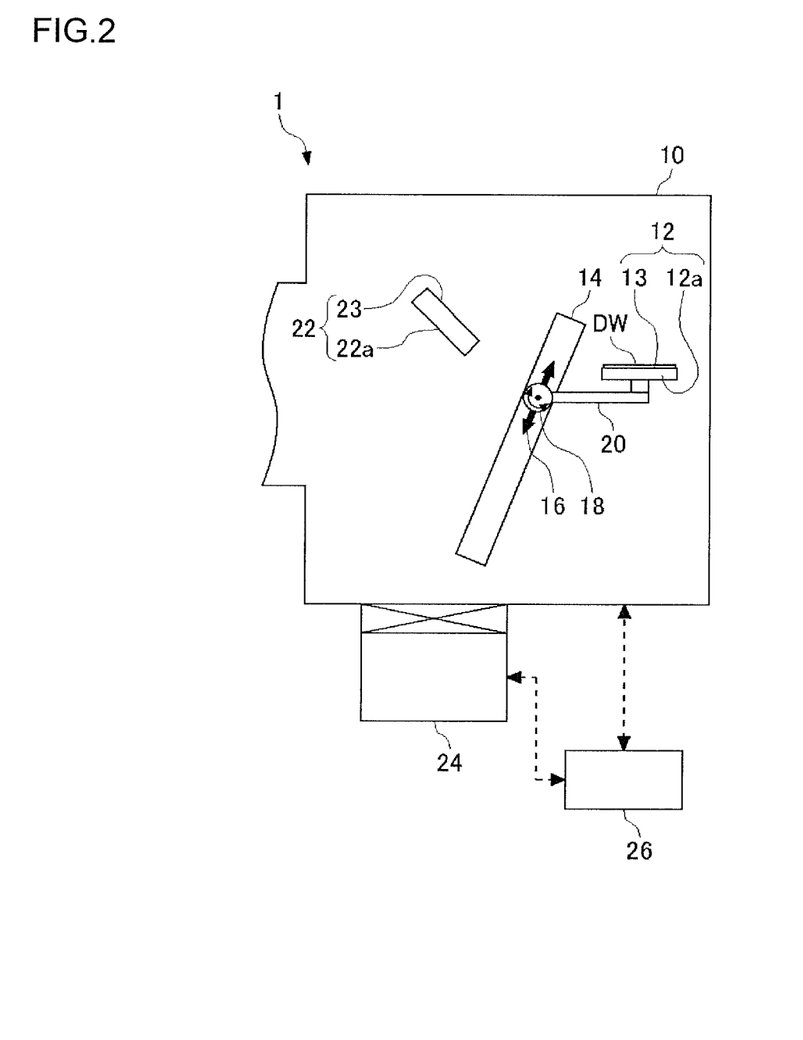
FIG. 2 schematically shows a part of an ion implantation device according to an embodiment of the present invention.

FIG. 2 shows another exemplary embodiment of the ESC protection operation. The exemplary embodiment shown in FIG. 2 differs from that of FIG. 1 in that a dummy substrate DW is used as a protective member instead of the shutter member 22 provided in the process chamber 10. The dummy substrate DW may be a wafer not used in a process or a member exclusively designed to protect the chuck surface 13. The control device 26 controls the ESC protection operation for covering the chuck surface 13 with the dummy substrate DW. The control device 26 controls the transportation of the dummy substrate DW into and out of the process chamber 10.

The dummy substrate DW is handled in the same way as the ordinary substrate W. The dummy substrate DW is transported into the process chamber 10 by the substrate handling device. The electrostatic chuck 12 is positioned so that the chuck surface 13 is in a horizontal position. The chuck surface 13 is exposed to receive the dummy substrate DW. The adsorption operation of the electrostatic chuck 12 is turned off. The dummy substrate DW is placed on the chuck surface 13. The electrostatic chuck 12 remains positioned so that the chuck surface 13 is in the horizontal position. In this way, a barrier for preventing adherence of foreign materials is provided to the chuck surface 13.

Preferably, the adsorption operation of the electrostatic chuck 12 is turned off even after the dummy substrate DW is placed in order to prevent reduction in the chuck performance. Alternatively, the electrostatic chuck 12 may secure the dummy substrate DW in its position with an adsorption power smaller than the electrostatic adsorption power during a normal process, in order to stabilize the position of the dummy substrate DW on the chuck surface 13.

When the ESC protection operation is terminated, the dummy substrate DW is retrieved from the chuck surface 13 by the substrate handling device. In case the dummy substrate DW is held by the electrostatic chuck 12, electrostatic adsorption is relieved before the dummy substrate DW is transported outside. In this way, the barrier provided to the chuck surface 13 is removed. The ion implantation process can then be resumed. A storage for the dummy substrate DW may be provided inside the process chamber 10.

As described above, ESC protection by the dummy substrate DW is suitable in a configuration in which the chuck surface 13 of the electrostatic chuck 12 can be held at a horizontal position. Meanwhile, ESC protection by the shutter member 22 provided in the process chamber 10 is suitable in a configuration in which the chuck surface 13 of the electrostatic chuck 12 can be held at an angle with respect to the horizontal plane.

Figure 3:
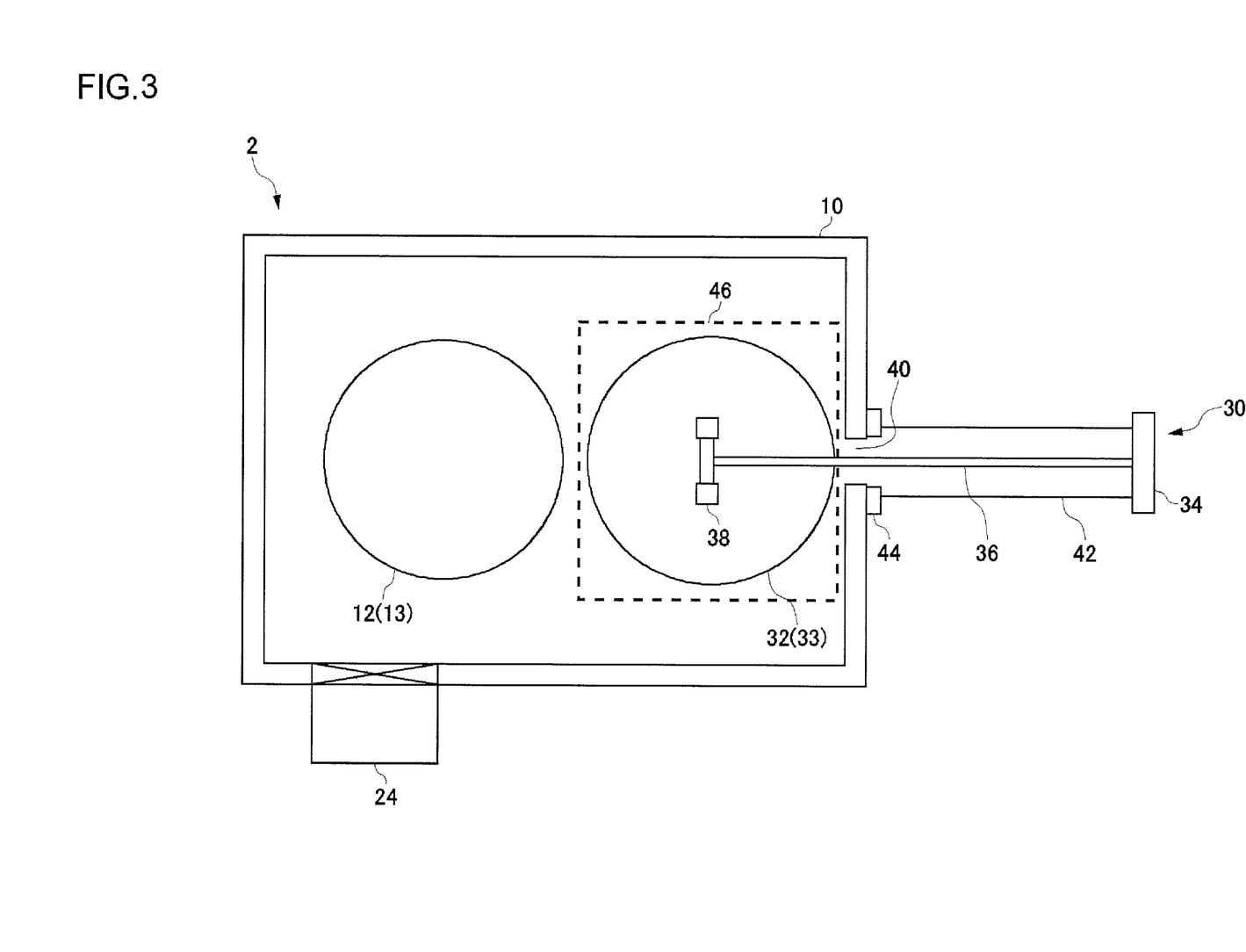
FIG. 3 schematically shows a part of a plasma treatment device according to an embodiment of the present invention.
Figure 4:
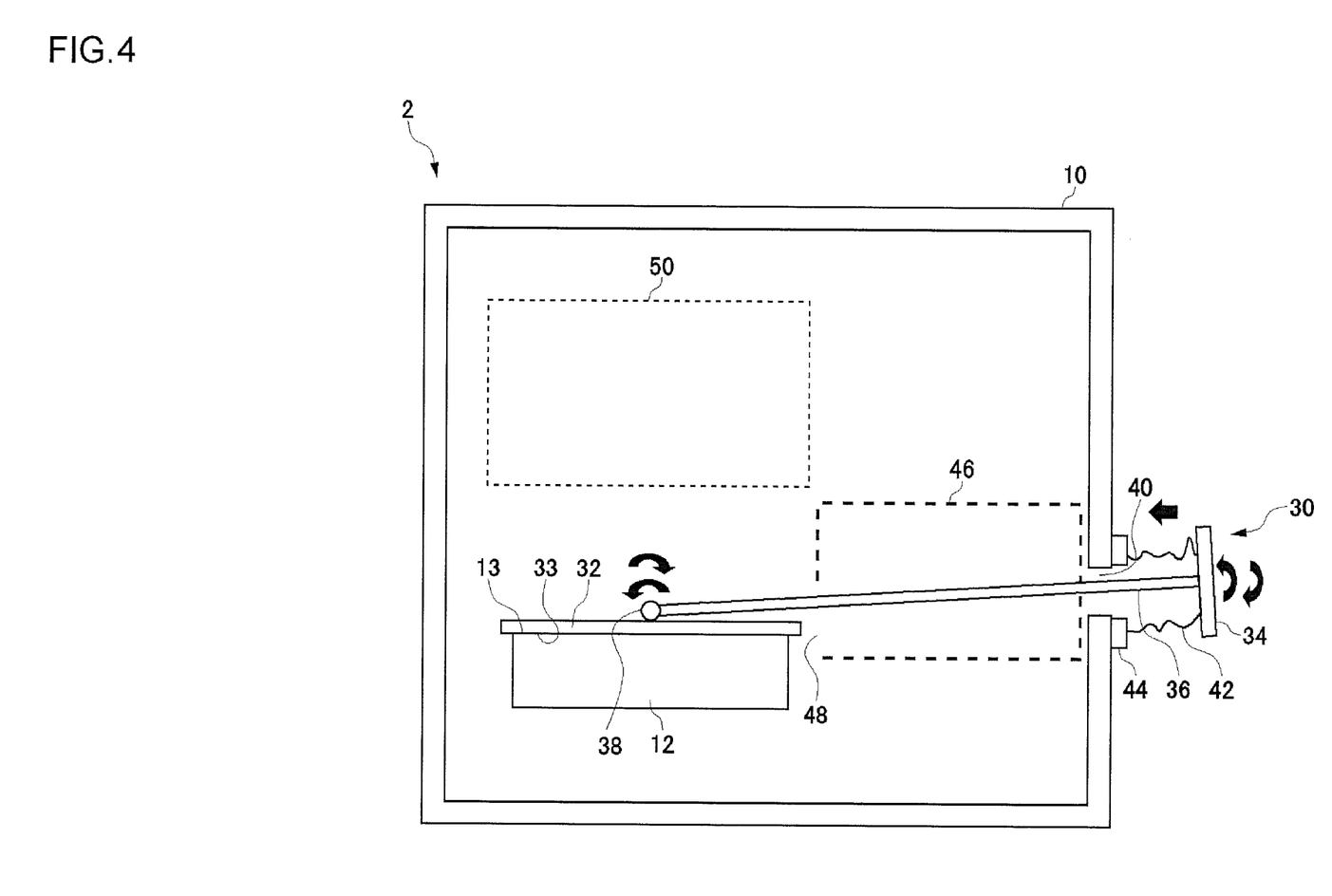
FIG. 4 schematically shows a part of a plasma treatment device according to an embodiment of the present invention.

FIGS. 3 and 4 schematically show a part of a plasma treatment apparatus or device 2 according to one embodiment of the present invention. The plasma treatment device 2 illustrated in FIGS. 3 and 4 is provided with a process chamber 10 for accommodating the electrostatic chuck 12, like the ion implantation device shown in FIG. 1. The electrostatic chuck 12 is secured to a substrate holder (not shown).

The plasma treatment device 2 is a device for plasma doping. Plasma doping is an example of a process for forming a desired impurity-doped layer on the surface of the substrate W. For example, impurities may be phosphorus or carbon. The plasma treatment device 2 is provided with a gas supplying unit for supplying a source gas in the controlled amount of flow and a plasma source for generating a plasma of the supplied gas. The vacuum pumping system 24 including, for example, a turbo molecular pump, is provided in the process chamber 10.

The process chamber 10 is provided with an ESC protection mechanism 30. The ESC protection mechanism 30 is configured to be manually operated by an operator. FIG. 3 shows that the ESC protection mechanism 30 is at a standby position occurring during a process. FIG. 4 shows that the ESC protection mechanism 30 is at a shielding position at which the electrostatic chuck 12 is shielded. FIG. 3 is a top view of the chuck surface 13 of the electrostatic chuck 12, showing the surface 13 as viewed from above, and FIG. 4 is a side view.

The ESC protection mechanics 30 is provided with a protective cover 32. The protective cover 32 is provided with a protective surface 33. The protective surface 33 is configured to be moveable between a standby position occurring during a process and a shielding position at which the chuck surface 13 is covered. The process chamber 10 may be provided with a window to view the electrostatic chuck 12 and the protective cover 32 from outside.

The ESC protection mechanics 30 is provided with a manipulator 34 embodied by a handle used by the operator for manipulation outside the process chamber 10, and an insertion rod 36 for connecting the manipulation handle 34 to the protective cover 32. The manipulator 34 is fixed to one end of the insertion rod 36. The protective cover 32 is rotatably fitted to the other end of the insertion rod 36 via a hinge 38. The insertion rod 36 is loosely inserted into an insertion aperture 40 formed in the wall of the process chamber 10.

The ESC protection mechanics 30 is provided with a bellows 42 and a vacuum seal 44 for air sealing the insertion aperture 40. One end of the bellows 42 is fitted to the manipulator 34 so that the portion of the insertion rod 36 projecting outward from the process chamber 10 is accommodated in the bellows 42. The other end of the bellows 42 is fitted to the wall portion of the process chamber 10 that defines the insertion aperture 40 via the vacuum seal 44. The bellows 42 can be expanded or retracted in a direction along the insertion rod 36 and is also deformable to a degree in a direction perpendicular to the direction of expansion or retraction.

The ESC protection mechanism 30 may be provided with a cover case 46 in order to suppress adherence of foreign materials on the protective cover 32 during a process. The cover case 46 has a size capable of accommodating the protective cover 32 at a standby position. The cover case 46 is formed with a cover port 48 for taking the protective cover 32 in or out. The cover port 48 is formed at a portion of the cover case 46 proximate to the electrostatic chuck 12.

The ESC protection operation is performed in this exemplary embodiment, too. The chuck surface 13 is covered in a process suspension period in order to prevent transfer of foreign materials including phosphorus or carbon from the surface of the process chamber 10 to the chuck surface 13. The operator can start and end the ESC protection operation at a desired point of time during a process suspension period. For example, the operator performs the ESC protection operation when the operation of the plasma treatment device 2 is continued while the vacuum pumping system 24 is turned off, or when the operation of the device is continued such that the pumping capabilities of the vacuum pumping system 24 is lowered than during a process. In this process, the process chamber 10 is air sealed so that vacuum is maintained.

After the plasma-doped substrate is transported out of the plasma treatment device 2, the chuck surface 13 is shielded. The operator manipulates the manipulator 34 to deform the bellows 42 and move the protective cover 32 at the standby position to the shielding position to shield the chuck surface 13. The operator brings the protective surface 33 of the protective cover 32 in contact with the chuck surface 13 so as to cover the chuck surface 13 with the protective cover 32. As the hinge 38 linking the protective cover 32 and the manipulator 34 is rotated, the protective surface 33 can be brought to complete contact with the chuck surface 13. The chuck surface 13 is shielded from a plasma space 50 above. In this way, a barrier for preventing adherence of foreign materials is provided to the chuck surface 13.

The operator returns the protective cover 32 from the chuck surface 13 to the standby position in an operation converse to the shielding operation. This removes the barrier provided to the chuck surface 13. The plasma-doping process can be performed again.

In place of the manual manipulation mechanism, the ESC protection mechanism 30 may be provided with a moving apparatus for moving the manipulator 34 or the protective cover 32. A dummy substrate may be used in the plasma treatment device 2 to protect the chuck surface 13, as in the exemplary embodiment shown in FIG. 2.

Figure 5:
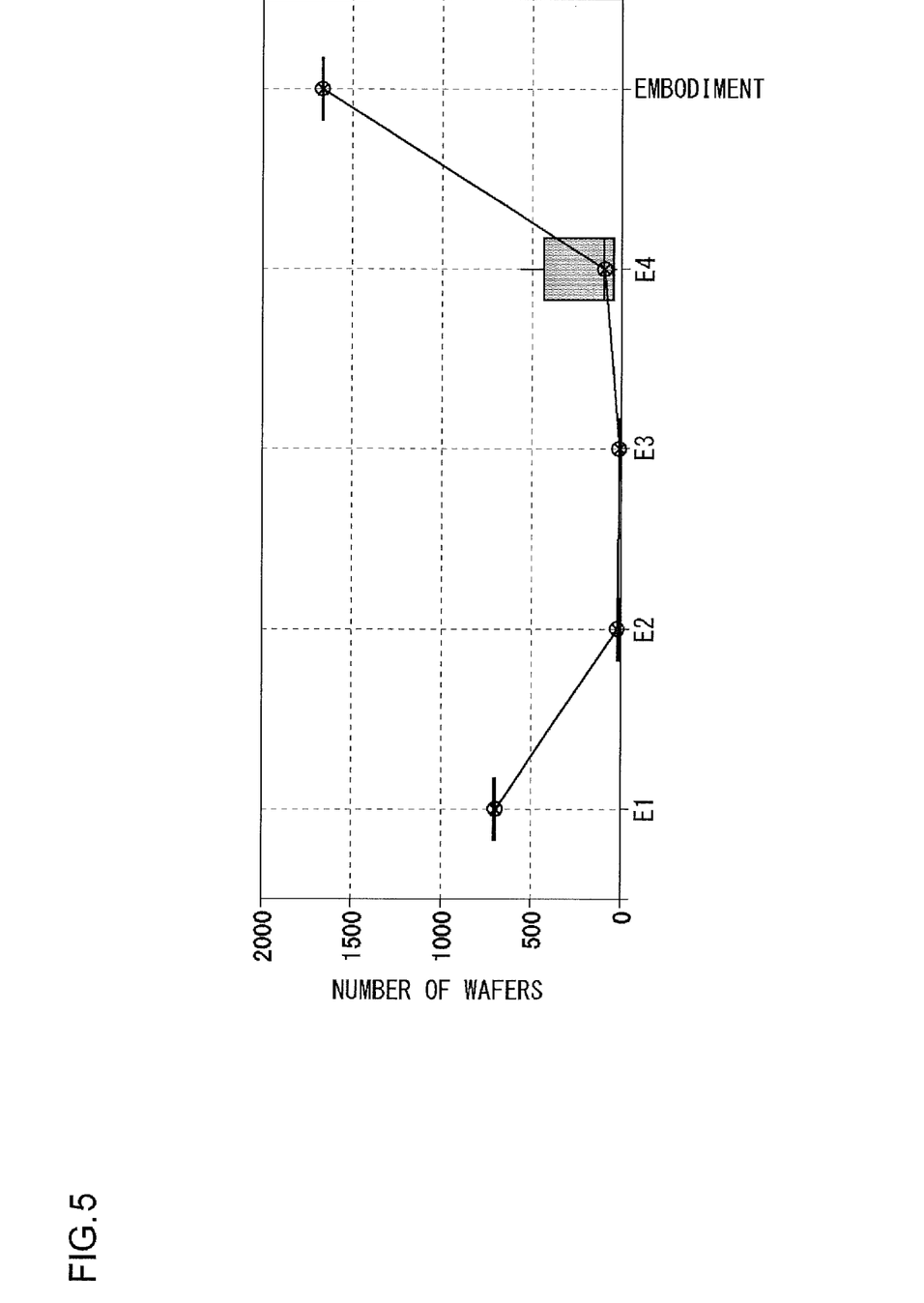
FIG. 5 shows an advantage of ESC protection according to an embodiment of the present invention.

FIG. 5 shows an advantage of ESC protection according to the embodiment of the present invention. FIG. 5 shows the number of wafers treated in a period between an occurrence of adsorption failure in the electrostatic chuck 12 and a subsequence occurrence of adsorption failure. The electrostatic chuck 12 in the plasma treatment device 2 in which an adsorption failure occurs is subject to ESC cleaning, and ESC protection using a dummy substrate is performed. ESC cleaning is a process of cleaning the surface of the electrostatic chuck 12. The operating condition for measuring the number of wafers is that the process is suspended for 10 hours or more on a weekday and for two days during a weekend. A dummy substrate is used for ESC protection during a process suspension period.

By way of comparison, FIG. 5 shows four methods of addressing an occurrence of adsorption failure. The four methods include maintenance of the chamber 10 (comparative example 1, shown as E1 in FIG. 5), ESC cleaning performed alone (comparative example 2, shown as E2), conditioning (comparative example 3, E3), and plasma recharging (comparative example 4, E4).

The maintenance according to comparative example 1 is an extensive process including opening the chamber 10 to air and cleaning the entirety (including the electrostatic chuck 12). In comparative example 2, chamber maintenance is skipped and only the electrostatic chuck 12 is cleaned. Conditioning according to comparative example 3 is a process of coating the entirety of the interior of the process chamber 10 with impurities (phosphorus). Plasma recharging according to comparative example 4 is a process of exposing the surface of the electrostatic chuck 12 with a plasma of, for example, helium. Plasma recharging is said to be useful to cleaning the surface of the ESC lightly and removing the surface charge.

As illustrated, the number of wafers treated until an adsorption failure occurs again in the electrostatic chuck 12 after a previous failure is addressed is about 700 in the case of comparative example 1, 1-100 in the case of comparative example 2. In the case of comparative example, 3, a failure occurs immediately after the previous failure is addressed. In the case of comparative example, 4, about 10-500 wafers are treated.

It is natural that a large number of wafers are treated in comparative example 1 because plasma doping is resumed immediately after the maintenance is completed, when substantially no amount of impurities adhered on the inner wall of the chamber is present. Comparative example 2 is not so useful because the impurities adhered on chamber surfaces other than the ESC are revaporized and adhered on the electrostatic chuck 12. Cleaning the electrostatic chuck 12 alone is virtually meaningless. Comparative example 3 is a process of purposefully blowing an impurity film onto the surface of the inner wall of the chamber and so is not useful. Comparative example 4 is not so useful, either. Large variance in the number of wafers in comparative example 4 is considered to be due to changing balance between the effect of cleaning the surface of the ESC and the amount of discharge from the chamber wall.

In comparison with these exemplary embodiments, the ESC protection method according to the embodiment of the present invention enables treatment of 1655 wafers without causing an adsorption failure additionally. In our experiment, measurement of the number of wafers is terminated when 1655 wafers are counted. Since an adsorption failure is not caused at that point of time, a larger number of wafers can be subsequently treated. A pronounced advantage provided by the embodiment of the present invention is that a larger number of wafers can be treated than when extensive chamber maintenance is performed, by using a simple approach of shielding the electrostatic chuck with a protective member. ESC protection according to the embodiment of the present invention helps improve the rate of operation of a vacuum processing device greatly.

Described above is an explanation based on an exemplary embodiment. The embodiment is intended to be illustrative only and it will be obvious to those skilled in the art that various modifications to constituting elements and processes could be developed and that such modifications are also within the scope of the present invention.

The electrostatic chuck protection mechanism or the electrostatic chuck protection method according to the embodiment of the present invention can be applied to a vacuum processing device provided with a process chamber for performing a process of forming a surface layer including a substance exhibiting volatility in a vacuum environment (e.g., a layer including phosphorus or carbon) on a substrate. Examples of such vacuum processing devices include the ion implantation device 1 and the plasma treatment device 2 described above. Other examples of vacuum processing devices include coating devices for coating a substrate such as chemical vapor deposition (CVD) or physical vapor deposition (PVD).

The electrostatic chuck protection method according to the embodiment may include providing the exposed chuck surface with a barrier for preventing adherence of foreign materials including a substance exhibiting volatility in a vacuum environment. The method may include removing the provided barrier in order to perform a process of forming a substrate electrostatically held on the chuck surface with a surface layer including a substance exhibiting volatility in a vacuum environment.

It should be understood that the invention is not limited to the above-described embodiment, but may be modified into various forms on the basis of the spirit of the invention. Additionally, the modifications are included in the scope of the invention.

Priority is claimed to Japanese Patent Application No. 2011-156015, filed Jul. 14, 2011, the entire content of which is incorporated herein by reference.

What is claimed is:

1. An impurity-doped layer formation apparatus comprising:
   a process chamber configured to perform a process of forming an impurity-doped layer including phosphorus or carbon on a substrate by irradiation of an ion beam including phosphorus or carbon onto the substrate; and
   an electrostatic chuck accommodated in the process chamber and including a chuck surface for holding the substrate,
   wherein the impurity-doped layer formation apparatus is configured to shield the chuck surface at least for a certain duration during a process suspension period, in order to suppress transfer of foreign materials including phosphorus or carbon from a surface of the process chamber to the chuck surface,
   wherein the process chamber comprises a protective member having a protective surface for shielding the chuck surface, wherein the protective member is located outside a path of the ion beam in the process chamber,
   wherein the apparatus further comprises a substrate holder configured to support the electrostatic chuck so as to hold the substrate upright during the process, wherein the substrate holder movably supports the electrostatic chuck to or from an evacuation position of the electrostatic chuck at which the chuck surface is in proximity to or in contact with the protective surface,
   wherein the substrate holder comprises a first driving unit that provides movement of the electrostatic chuck in a first direction for mechanical scan of the substrate relative to the ion beam, and a second driving unit that provides movement of the electrostatic chuck in a second direction different from the first direction, wherein the second driving unit moves the electrostatic chuck to or from the evacuation position, wherein the first driving unit is mounted on the second driving unit so that the first driving unit can be moved by the second driving unit in the second direction, wherein the protective member is located on a path of movement of the electrostatic chuck by the second driving unit, and wherein the evacuation position of the electrostatic chuck is defined at an end of a range of movement in which the electrostatic chuck can be moved by the second driving unit.

2. The apparatus according to claim 1, further comprising:

a vacuum pumping system for evacuating the process chamber, wherein vacuum is maintained in the process chamber and the vacuum pumping system is suspended for at least a certain duration during the process suspended period.

3. The apparatus according to claim 1, wherein an adsorption operation of the electrostatic chuck is suspended while the chuck surface is shielded.

4. The apparatus according to claim 1, wherein the protective surface is configured to be movable between a standby position during the process and a shielding position at which the chuck surface is shielded.

5. The apparatus according to claim 1, further comprising:

a control unit configured to control a protection operation for shielding the chuck surface with a protective member.

6. A vacuum processing apparatus comprising:

a process chamber configured to perform a process of forming a surface layer including a substance exhibiting volatility in a vacuum environment on a substrate by irradiation of an ion beam including the substance onto the substrate; and an electrostatic chuck accommodated in the process chamber and including a chuck surface for holding the substrate, wherein a shield for the chuck surface is provided at least for a certain duration during a process suspension period in order to suppress transfer of foreign materials including the substance from a surface of the process chamber to the chuck surface, and the shield for the chuck surface is removed while the process is being performed, wherein the process chamber comprises a protective member having a protective surface for shielding the chuck surface, wherein the protective member is located outside a path of the ion beam in the process chamber, wherein the apparatus further comprises a substrate holder configured to support the electrostatic chuck so as to hold the substrate upright during the process, wherein the substrate holder movably supports the electrostatic chuck to or from an evacuation position of the electrostatic chuck at which the chuck surface is in proximity to or in contact with the protective surface, wherein the substrate holder comprises a first driving unit that provides movement of the electrostatic chuck in a first direction for mechanical scan of the substrate relative to the ion beam, and a second driving unit that provides movement of the electrostatic chuck in a second direction different from the first direction, wherein the second driving unit moves the electrostatic chuck to or from the evacuation position, wherein the first driving unit is mounted on the second driving unit so that the first driving unit can be moved by the second driving unit in the second direction, wherein the protective member is located on a path of movement of the electrostatic chuck by the second driving unit, and wherein the evacuation position of the electrostatic chuck is defined at an end of a range of movement in which the electrostatic chuck can be moved by the second driving unit.

7. The apparatus according to claim 1, wherein the second direction is a rotational direction about an axis perpendicular to the first direction.

8. The apparatus according to claim 1, wherein an ion beam emission port is provided within the process chamber to receive the ion beam from upstream of the process chamber, and wherein the protective member is located toward the ion beam emission port with respect to a path of the substrate in the mechanical scan provided by the first driving unit.

9. The apparatus according to claim 1, wherein the protective member is secured inside the process chamber.

* * * * *